United States Patent
Kai

(10) Patent No.: US 8,587,782 B2
(45) Date of Patent: Nov. 19, 2013

(54) OPTICAL-COMPONENT FABRICATING METHOD AND OPTICAL-COMPONENT FABRICATING APPARATUS

(75) Inventor: Satoshi Kai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 13 days.

(21) Appl. No.: 13/398,073

(22) Filed: Feb. 16, 2012

(65) Prior Publication Data

US 2012/0147372 A1 Jun. 14, 2012

Related U.S. Application Data

(63) Continuation of application No. PCT/JP2009/065052, filed on Aug. 28, 2009.

(51) Int. Cl.
*G01B 11/00* (2006.01)
*G03F 9/00* (2006.01)
*G03C 5/00* (2006.01)

(52) U.S. Cl.
USPC ............................... 356/401; 430/22; 430/30

(58) Field of Classification Search
None
See application file for complete search history.

(56) References Cited

U.S. PATENT DOCUMENTS

| | | | |
|---|---|---|---|
| 4,941,745 A | 7/1990 | Sugiyama | |
| 5,262,257 A * | 11/1993 | Fukuda et al. | 430/5 |
| 5,405,810 A * | 4/1995 | Mizuno et al. | 438/16 |
| 5,440,138 A | 8/1995 | Nishi | |
| 5,700,626 A * | 12/1997 | Lee et al. | 430/296 |
| 5,773,180 A * | 6/1998 | Tomimatu | 430/22 |
| 6,312,859 B1 * | 11/2001 | Taniguchi | 430/22 |
| 6,417,076 B1 * | 7/2002 | Holscher et al. | 438/462 |
| 6,559,926 B2 | 5/2003 | Yamaguchi et al. | |
| 6,875,624 B2 * | 4/2005 | Lin | 438/16 |
| 6,946,666 B2 | 9/2005 | Saito et al. | |
| 7,108,946 B1 * | 9/2006 | Lukanc et al. | 430/22 |
| 7,820,366 B2 * | 10/2010 | Tajima et al. | 430/312 |
| 2004/0156027 A1 * | 8/2004 | Best et al. | 355/53 |
| 2009/0230571 A1 * | 9/2009 | Chen et al. | 257/797 |
| 2009/0269685 A1 * | 10/2009 | Yanagawa et al. | 430/30 |

FOREIGN PATENT DOCUMENTS

| | | | |
|---|---|---|---|
| JP | 63-275115 A | | 11/1988 |
| JP | 1-179318 A | | 7/1989 |
| JP | 6-204105 A | | 7/1994 |
| JP | 10223518 A | * | 8/1998 |
| JP | 10-326742 A | | 12/1998 |
| JP | 2002-190444 A | | 7/2002 |
| JP | 2003-86484 A | | 3/2003 |

(Continued)

OTHER PUBLICATIONS

International Search Report of PCT/JP2009/065052, mailing date of Dec. 1, 2009.

*Primary Examiner* — Gordon Stock, Jr.
(74) *Attorney, Agent, or Firm* — Westerman, Hattori, Daniels & Adrian, LLP

(57) ABSTRACT

An optical-component fabricating method includes arranging a mask that has both an optical component pattern and an alignment mark pattern and a wafer that is developed through the mask at predetermined positions; exposing the optical component pattern and the alignment mark pattern onto the wafer; developing the alignment mark pattern that is exposed on the wafer; observing a position of the developed alignment mark pattern and moving the wafer in accordance with the position; repeating the exposing, the developing, and the moving a predetermined number of times;
developing all the optical component patterns on the wafer; and etching the developed optical component patterns.

5 Claims, 11 Drawing Sheets

(56) References Cited

FOREIGN PATENT DOCUMENTS

| JP | 2003-305700 A | | 10/2003 |
|----|---------------|---|---------|
| JP | 2004-200509 A | | 7/2004 |
| JP | 2005283893 A | * | 10/2005 |
| JP | 2006-310446 A | | 11/2006 |

* cited by examiner

FIG.2
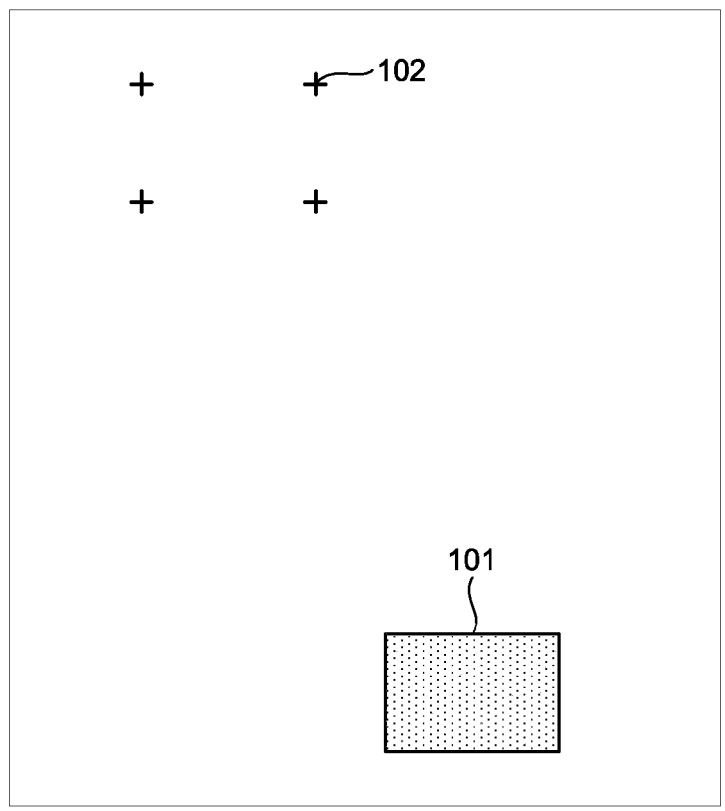
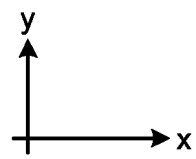
PATTERN COORDINATE AXIS

FIG.7
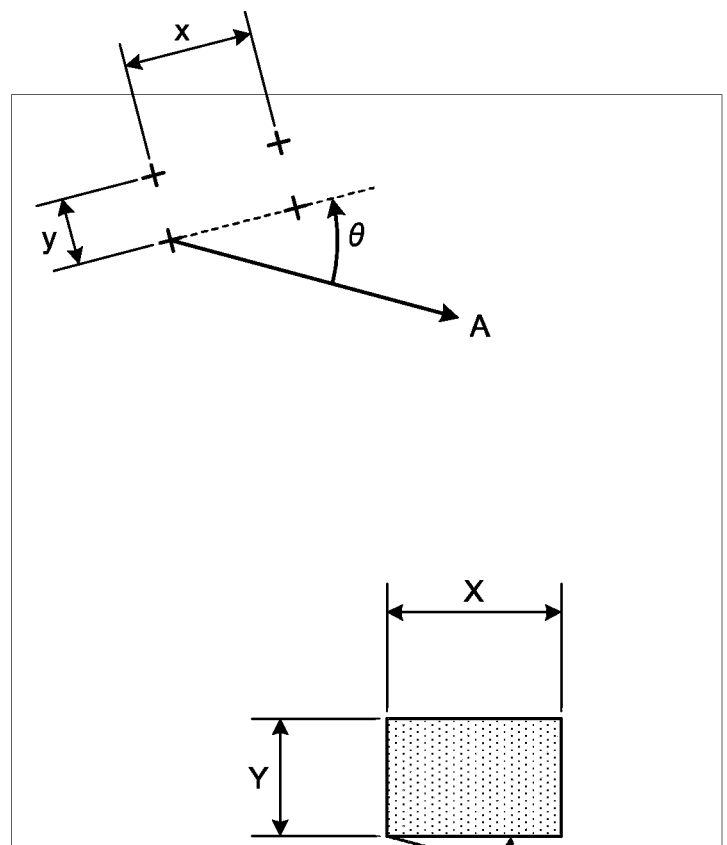
STAGE MOVING AXIS

FIG.8
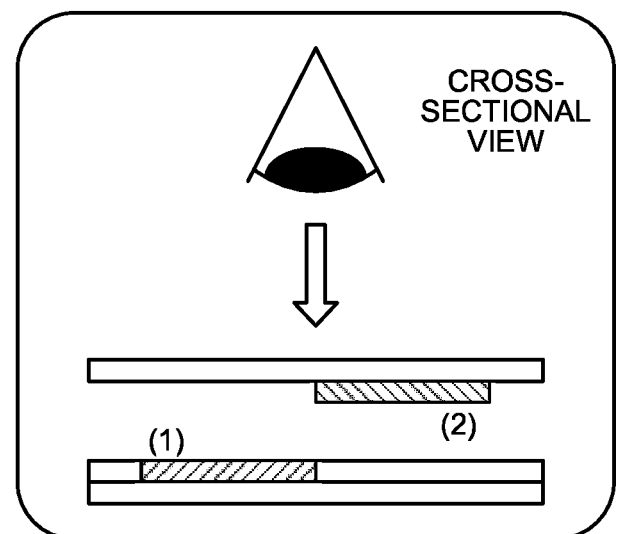
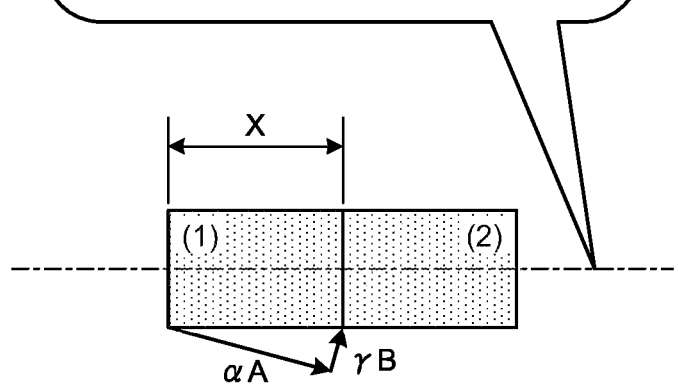
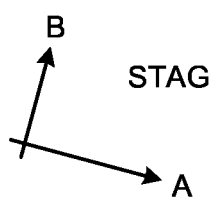
STAGE MOVING AXIS
(1) DEVELOPED PATTERN
(2) PATTERN ON MASK

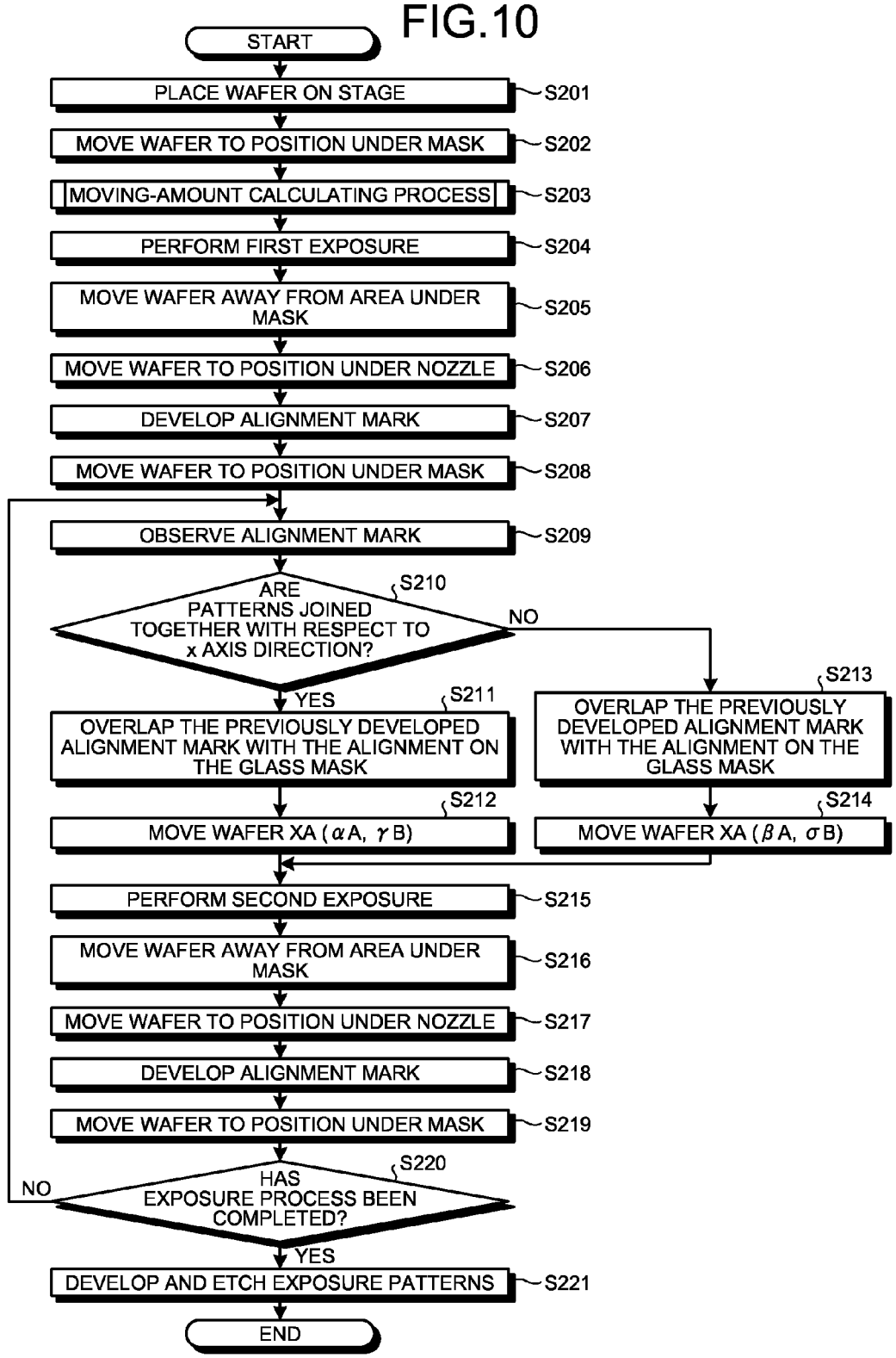

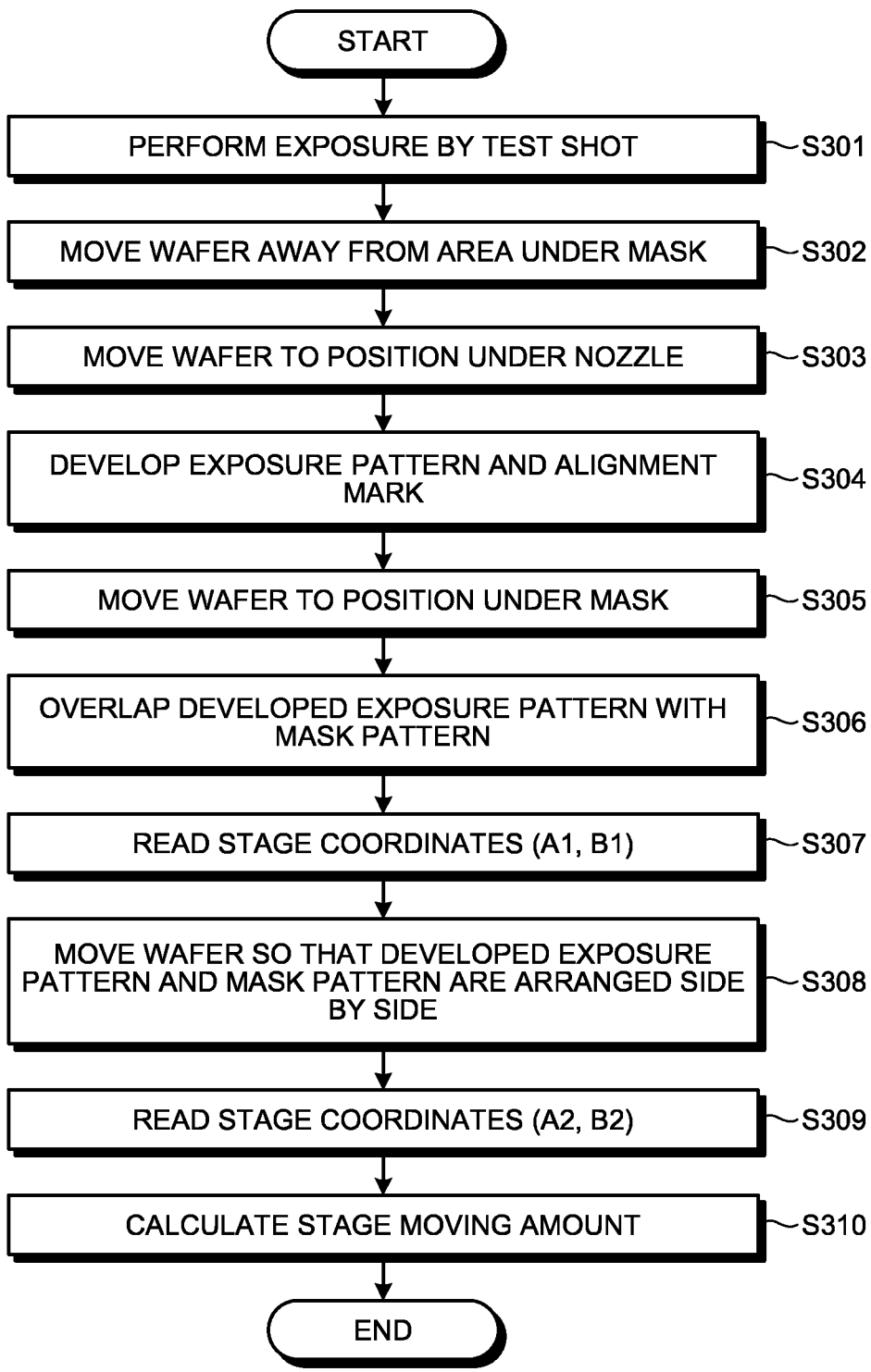

OPTICAL-COMPONENT FABRICATING METHOD AND OPTICAL-COMPONENT FABRICATING APPARATUS

CROSS-REFERENCE TO RELATED APPLICATION

This application is a continuation of International Application No. PCT/JP2009/065052, filed on Aug. 28, 2009, the entire contents of which are incorporated herein by reference.

FIELD

The embodiments discussed herein are directed to an optical-component fabricating method that involves developing an optical-component pattern that is exposed onto a wafer and etching the developed optical-component pattern, thereby fabricating an optical component, and the embodiments discussed herein are also directed to an optical-component fabricating apparatus.

BACKGROUND

For the purpose of fabricating an optical component, etc., a conventional method of fabricating an optical component is known that involves exposing an optical component pattern onto a wafer and then developing the exposed optical component pattern. For example, an optical-component fabricating apparatus has, above an upper section of a wafer that is arranged on a stage, a glass mask on which an exposure pattern is formed and emits light from above the glass mask, thereby exposing the exposure pattern onto the wafer.

A method performed by such an optical-component fabricating apparatus is known that involves, when an optical component that occupies an area larger than the area exposed by one shot of light, sequentially joining exposure patterns together on a wafer. Moreover, if, in an optical-component fabricating apparatus, the position of a stage is incorrect, the position of the pattern that is exposed onto a wafer may be incorrect.

A pattern-misalignment preventing technology is known that involves detecting the amount of mismatch between a mask and a stage before exposure, then moving the stage in accordance with the detected amount of mismatch, and then exposing an exposure pattern onto the wafer. More particularly, before exposure, the optical-component fabricating apparatus detects the amount of mismatch between the mask and the stage and stores it. The optical-component fabricating apparatus then decides the position to be exposed to a shot in accordance with the stored amount of mismatch and exposes the patterns on the wafer in sequence with no gaps between them.

Another pattern-misalignment preventing technology is known that involves exposing a position-alignment mark onto a wafer that is coated with a resist and deciding the next position to be exposed to a shot in accordance with the position of the exposed position-alignment mark.

More particularly, the optical-component fabricating apparatus exposes a position-alignment mark onto a wafer that is coated with a resist. After that, to detect the position-alignment mark, the optical-component fabricating apparatus detects, by using detection light having a waveband different from that of the exposure light, the exposed position-alignment mark so that the resist is not exposed. Regarding the resist applied to the wafer, for the purpose of detecting the exposed position-alignment mark, a photosensitizer is used for which the refractive index of the detection light is clearly different from the refractive index of the exposure light.

Patent document 1: Japanese Laid-open Patent Publication No. 2003-86484
Patent document 2: Japanese Laid-open Patent Publication No. 6-204105
Patent document 3: Japanese Laid-open Patent Publication No. 10-326742
Patent document 4: Japanese Laid-open Patent Publication No. 2002-190444
Patent document 5: Japanese Laid-open Patent Publication No. 2003-305700

Because, in the abovementioned pattern-misalignment preventing technology that involves detecting the amount of misalignment before exposure, a position to be exposed to a shot is decided by using the amount of misalignment that is detected before exposure, it is impossible to correct any misalignment that occurs after the amount of misalignment is detected. If, for example, a misalignment occurs due to mechanical driving, etc., between a mask and a stage after the amount of misalignment is detected, it is impossible to join the patterns together accurately.

Moreover, the above technology using an exposed position-alignment mark has a disadvantage in that, for the purpose of detecting an exposed position-alignment mark, the type of the resist applied to a wafer is limited. For example, as a resist which is applied on a wafer for the purpose of detecting an exposed position-alignment mark, a photosensitizer that has clearly different refractive indexes is often used.

The present invention has been made to solve the above problems with the conventional technologies and it is an object of the present invention to join patterns together accurately without limiting the type of the resist used.

SUMMARY

According to an aspect of an embodiment of the invention, an optical-component fabricating method includes arranging a mask that has both an optical component pattern and an alignment mark pattern and a wafer that is developed through the mask at predetermined positions; exposing the optical component pattern and the alignment mark pattern onto the wafer; developing the alignment mark pattern that is exposed on the wafer; observing a position of the developed alignment mark pattern and moving the wafer in accordance with the position; repeating the exposing, the developing, and the moving a predetermined number of times; developing all the optical component patterns on the wafer; and etching the developed optical component patterns.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 2 is a diagram that illustrates an example of an exposure pattern and an example of an alignment mark on the glass mask;

FIG. 7 is a diagram that illustrates the relation between a pattern and an alignment mark;

FIG. 8 is a diagram that illustrates a moving-amount-for-joining calculating process;

FIG. 10 is a flowchart of a process performed by an optical-component fabricating apparatus according to a second embodiment; and FIG. 11 is a flowchart of a moving-amount calculating process performed by the optical-component fabricating apparatus according to the second embodiment.

DESCRIPTION OF EMBODIMENTS

Preferred embodiments of the present invention will be explained with reference to accompanying drawings.

[a] First Embodiment

The following explanation of the embodiment contains the configuration of an optical-component fabricating apparatus according to the first embodiment, then the processing flow according to the first embodiment, and finally the effects of the first embodiment.

Configuration of Optical-Component Fabricating Apparatus

Figure 1:
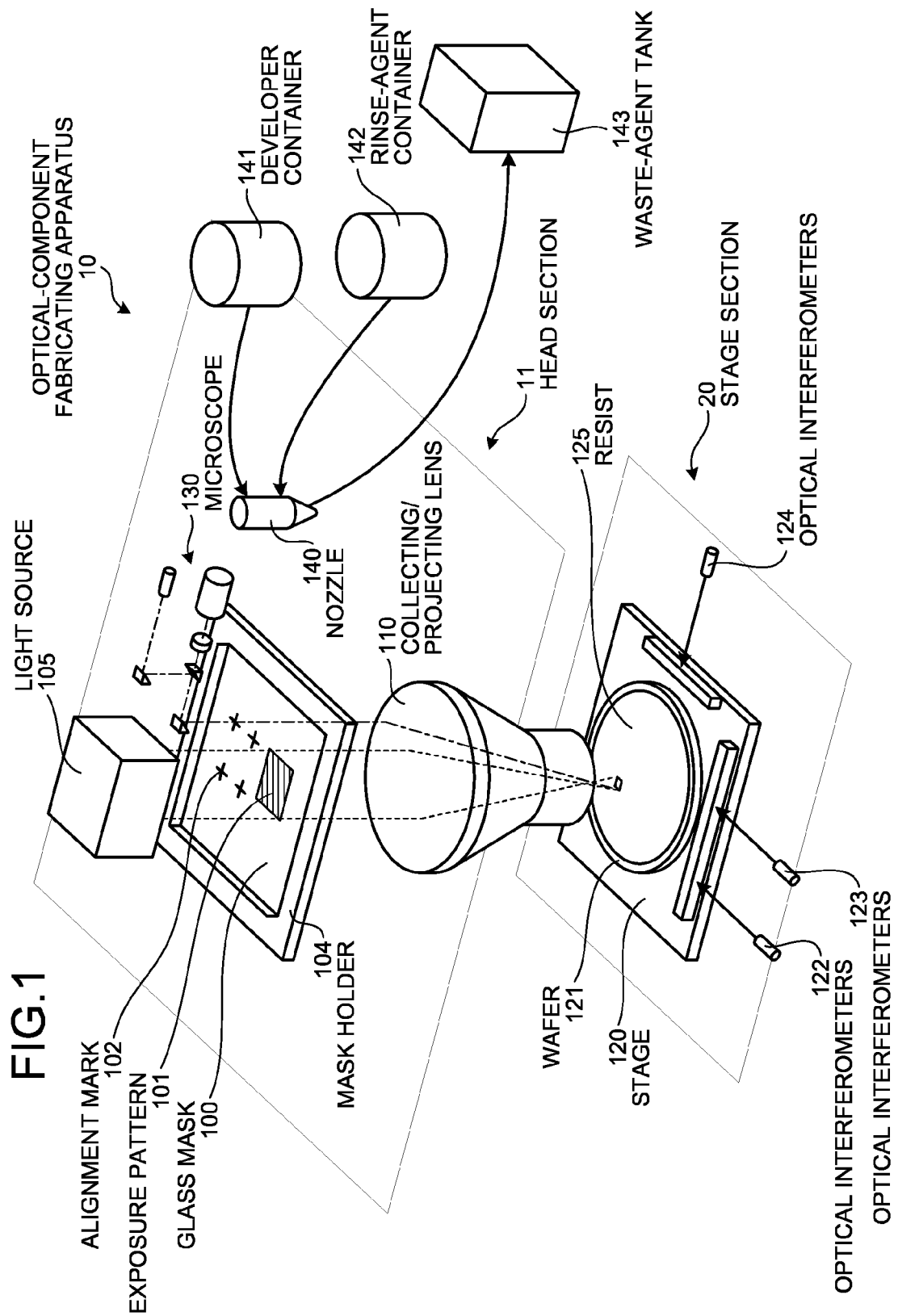
FIG. 1 is a block diagram of the configuration of an optical-component fabricating apparatus according to a first embodiment.

Firstly, the configuration of an optical-component fabricating apparatus 10 will be explained with reference to FIG. 1. FIG. 1 is a block diagram of the configuration of the optical-component fabricating apparatus 10 according to the first embodiment. As illustrated in the figure, the optical-component fabricating apparatus 10 includes a head section 11 and a stage section 20.

The head section 11 includes a glass mask 100, an exposure pattern 101, an alignment mark 102, a mask holder 104, a light source 105, a microscope 130, and a nozzle 140. The stage section 20 includes a stage 120, a wafer 121, a plurality of optical interferometers 122 to 124, and a resist 125. The processing of each of the units will be explained below.

The glass mask 100 has both the exposure pattern 101 and the alignment mark 102 for position detection formed thereon, and is set at the mask holder 104. For example, as illustrated in FIG. 2, the glass mask 100 has both the exposure pattern 101 and the alignment mark 102 for position detection formed thereon. FIG. 2 is a diagram that illustrates an example of the exposure pattern and an example of the alignment mark on the glass mask.

The mask holder 104 holds the glass mask 100 that has both the exposure pattern 101 and the alignment mark 102. The mask holder 104 fixes the glass mask to a position through which light emitted from the light source 105 passes.

The exposure pattern 101 is a pattern that is formed on the glass mask 100 and is exposed on the wafer 121 with light that is emitted from the light source 105. The alignment mark 102 is a pattern that is formed on the glass mask 100 and is exposed on the wafer 121 for alignment of the exposure pattern 101.

The relation between the exposure pattern and the alignment mark will be explained below with reference to FIG. 3.

Figure 3:
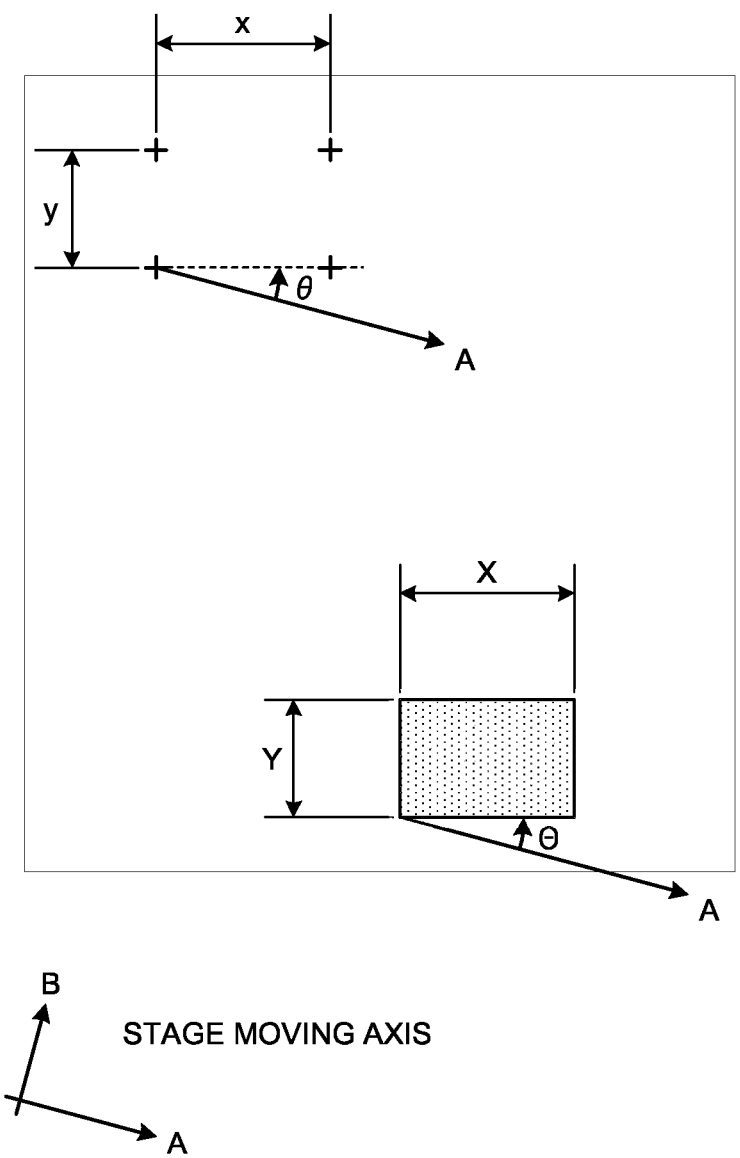
FIG. 3 is a diagram that illustrates the relation between a pattern and an alignment mark.

FIG. 3 is a diagram that illustrates the relation between the pattern and the alignment mark. The glass mask 100, which has both the exposure pattern 101 and the alignment mark 102 for position detection formed thereon as illustrated in FIG. 3, is fixed to the mask holder 104.

The exposure pattern and the alignment mark of the glass mask 100 are formed such that a pattern width X is equal to an alignment-mark width x and a pattern height Y is equal to an alignment-mark height y. In the glass mask 100, an angle Θ between the pattern and a stage moving axis is equal to an angle θ between the alignment mark and the stage moving axis, and the shape of the pattern is the same as the shape of the alignment mark.

The light source 105 exposes both the exposure pattern 101 and the alignment mark 102 for position detection onto the wafer 121. More particularly, the light source 105 emits light from above the glass mask 100, thereby exposing both the exposure pattern 101 and the alignment mark 102 for position detection onto the wafer 121. The emitted light passes through the glass mask 100 and a collecting/projecting lens 110 and then projects the exposure pattern 101 on an object to be exposed that is arranged on the substrate stage 120 or the resist 125 that is applied on the wafer 121.

The microscope 130 is used to observe the position of the alignment mark 102 that is developed on the glass mask 100. The nozzle 140 is used to partially develop the alignment mark 102 that is exposed on the wafer 121. The nozzle 140 includes a developer nozzle, a rinse-agent nozzle, and a suction nozzle that are connected to a developer container 141, a rinse-agent container 142, and a waste-agent tank 143, respectively.

The nozzle 140 ejects a developer or a rinse agent onto the wafer 121 and sucks any agent from the wafer 121 to the waste-agent tank 143. More particularly, when the stage 120 is moved and the nozzle 140 is moved to a position above a projected pattern, the nozzle 140 ejects the developer from the developer container 141 onto the substrate and then sucks the agent to the waste-agent tank 143. The nozzle 140 also ejects the agent from the rinse-agent container 142 onto the substrate and then sucks the agent to the waste-agent tank 143.

The stage 120 holds the wafer 121, which is an object to be developed through the glass mask 100, and moves the wafer 121 on a plane parallel to the glass mask 100. The angle of the stage 120 is adjustable with respect to both the up-and-down direction and the right-and-left direction by operation of the optical interferometers 122 to 124.

The wafer 121 is an object to be exposed that is arranged on the stage 120. The optical interferometers 122 to 124 control the stage 120 in accordance with the position, thereby deciding the position of the wafer 121. More particularly, the optical interferometers 122 to 124 adjust the angle of the stage 120 with respect to both the up-and-down direction and the right-and-left direction, thereby deciding the position of the wafer 121. The resist 125 is applied on the wafer 121. A resist layer is formed uniformly on the surface of the wafer 121.

Figure 4:
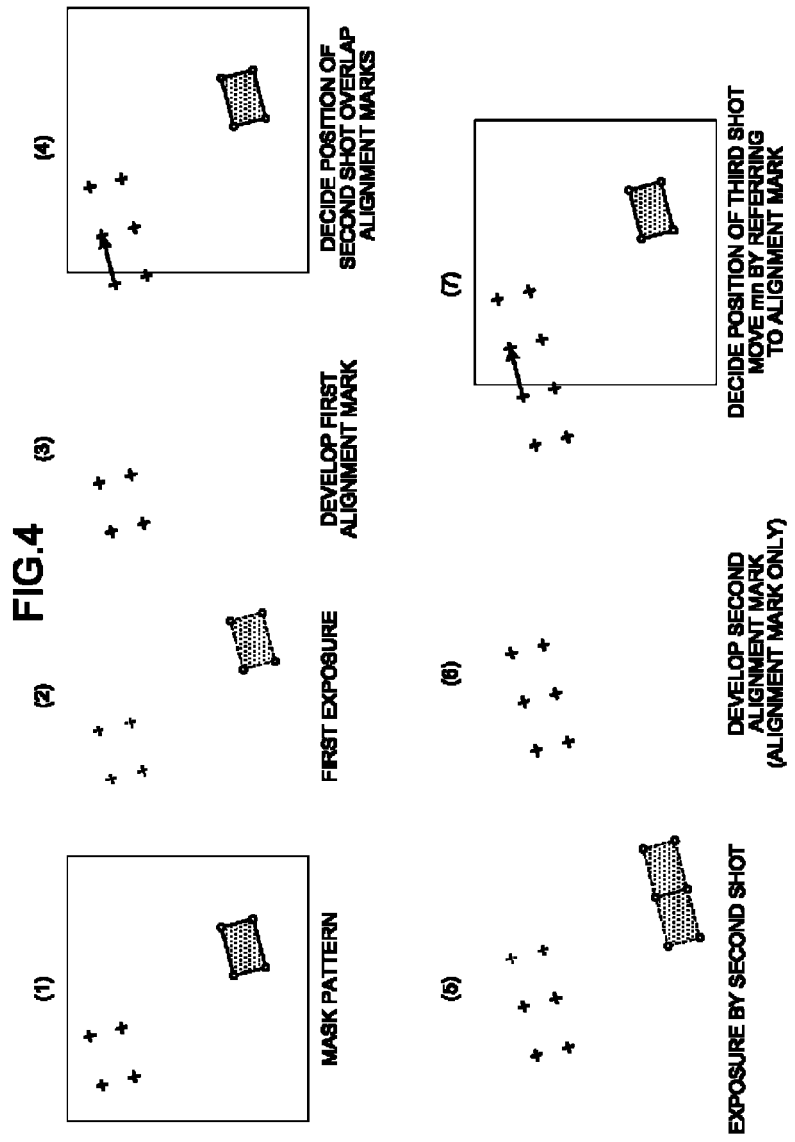
FIG. 4 is a diagram that illustrates a position aligning process by using the alignment mark.

The process will be explained below with reference to FIG. 4 that involves performing position alignment by using an alignment mark and then joining exposure patterns together. FIG. 4 is a diagram that illustrates a position aligning process by using an alignment mark. FIG. 4 illustrates an example in which exposure patterns are joined together with respect to the x axis direction.

As illustrated in FIG. 4, the glass mask 100 of the optical-component fabricating apparatus 10 has both the exposure pattern 101 and the alignment mark 102 formed thereon (see (1) of FIG. 4). The optical-component fabricating apparatus 10 performs a first exposure, thereby exposing both the exposure pattern 101 and the alignment mark 102 onto the wafer 121 (see (2) of FIG. 4) and then develops the alignment mark exposed by the first exposure (see (3) of FIG. 4).

Subsequently, before a second positioning, the optical-component fabricating apparatus 10 moves the stage 120 so that the right edge of the first alignment mark developed on the wafer 121 overlaps with the left edge of the alignment mark 102 formed on the glass mask (see (4) of FIG. 4).

The optical-component fabricating apparatus 10 then emits a second shot of light, thereby exposing both the exposure pattern 101 and the alignment mark 102 onto the wafer 121 (see (5) of FIG. 4), and develops the alignment mark exposed by the second shot (see (6) of FIG. 4). After that, before a third positioning, the optical-component fabricating apparatus 10 moves the stage 120 so that the right edge of the second alignment mark developed on the wafer 121 overlaps with the left edge of the alignment mark 102 formed on the glass mask (see (7) of FIG. 4).

In other words, when the exposure patterns 101 are joined together, the optical-component fabricating apparatus 10 develops the alignment marks 102 that are arranged in a certain relative positional relation and decides the next position to be exposed to a shot in accordance with the developed alignment marks. Therefore, because misalignment of the wafer caused by mechanical driving is not affected, it is possible to join patterns together accurately.

Figure 5:
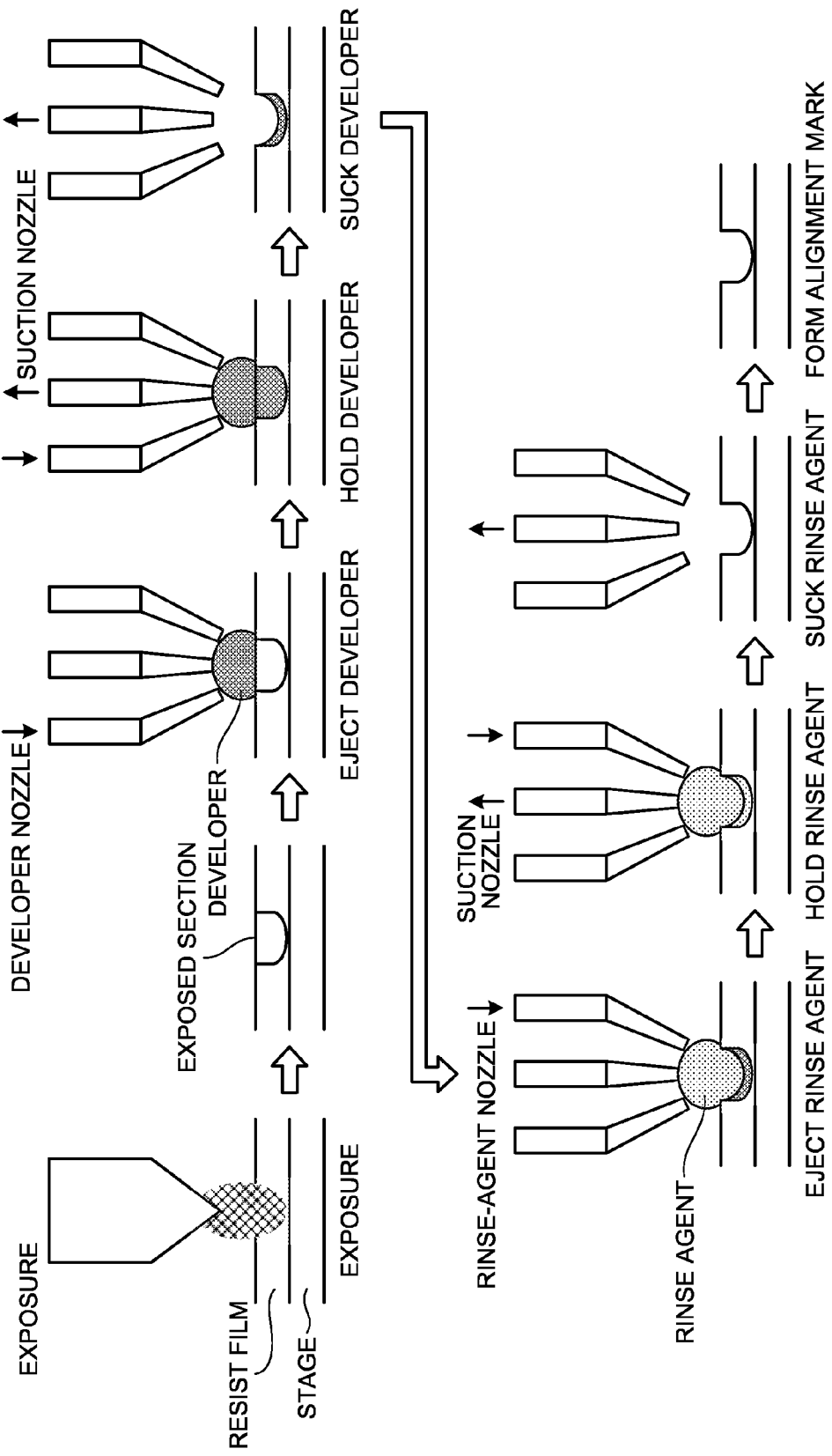
FIG. 5 is a diagram that illustrates a developing process in mid-process.

The partially developing process of developing an exposed alignment mark will be explained below with reference to FIG. 5. FIG. 5 is a diagram that illustrates the partially developing process. As illustrated in FIG. 5, when the optical-component fabricating apparatus 10 performs the first exposure, the exposure pattern 101 and the alignment mark 102 are projected with light emitted from the light source 105, collected by the lens 110, and printed on the resist film of the wafer 121. A printed section is called "exposed section".

The optical-component fabricating apparatus 10 moves the stage 120 so that the developing nozzle is moved to a position above the exposed alignment mark. Subsequently, the developer is supplied from the developer container 141 through the developer nozzle and the developer is then ejected from the developer nozzle.

The ejected developer is held on the alignment mark between the substrate and the end of the nozzle and then sucked to the waste-agent tank 143 through the suction nozzle to prevent the developer from spreading widely. After the developer is held on the alignment mark for a predetermined time by the developer supplying/ejecting, the optical-component fabricating apparatus 10 stops the supply of the developer, and then ejects the rinse agent from the rinse-agent container 142 through the rinse-agent nozzle onto the alignment mark.

The ejected rinse agent is held on the alignment mark between the substrate and the end of the nozzle and then sucked by the suction nozzle 140 to the waste-agent tank 143 to prevent the rinse agent from spreading widely. After the rinse agent is held on the alignment mark for a predetermined time by the rinse agent supplying/ejecting, the optical-component fabricating apparatus 10 stops the supply of the rinse agent. The partially developing process of developing the alignment mark is finished and the alignment mark is formed.

Process Performed by Optical-Component Fabricating Apparatus

Figure 6:
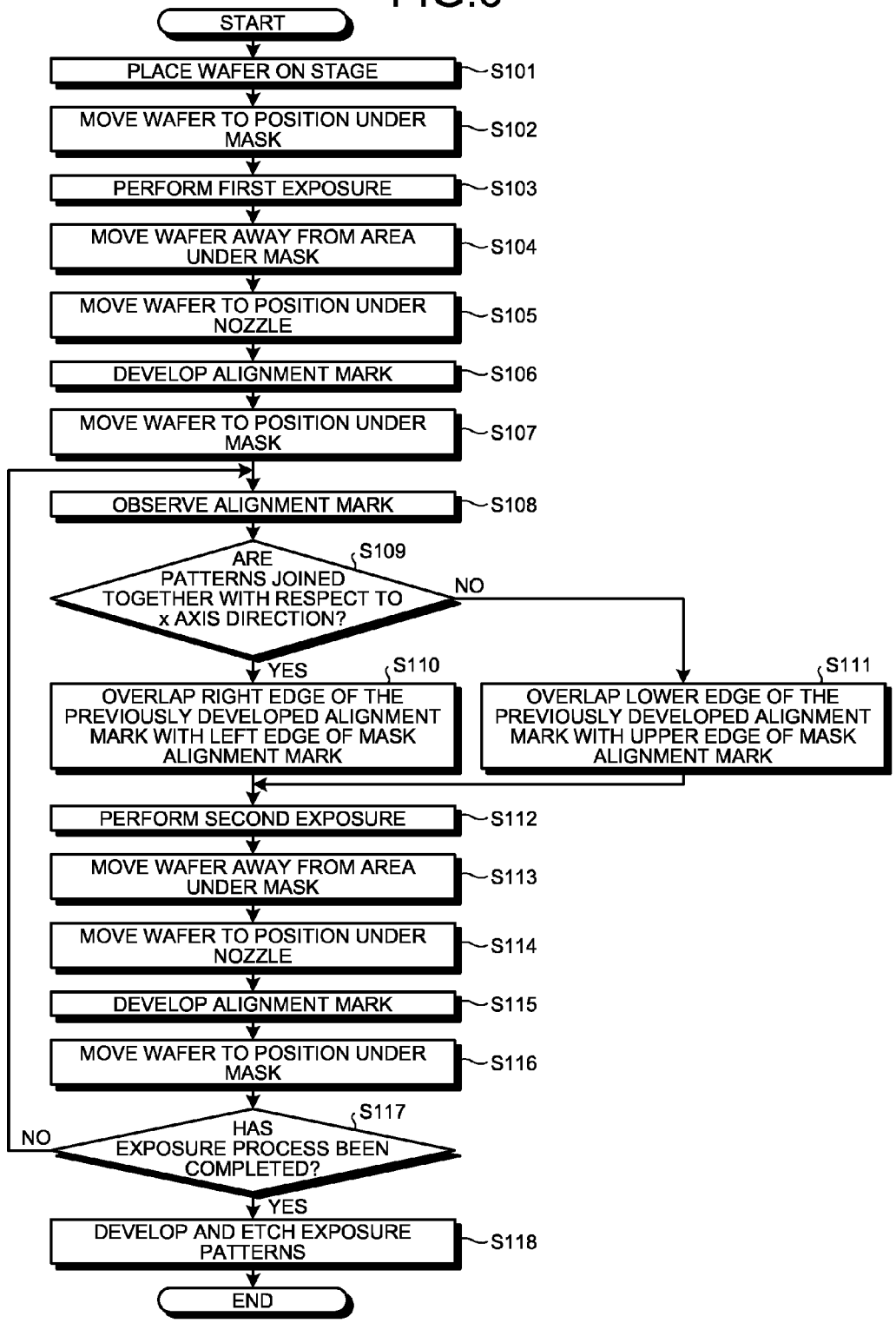
FIG. 6 is a flowchart of a process performed by the optical-component fabricating apparatus according to the first embodiment.

The process performed by the optical-component fabricating apparatus 10 will be explained below with reference to FIG. 6 according to the first embodiment. FIG. 6 is a flowchart of the process performed by the optical-component fabricating apparatus 10 according to the first embodiment.

As illustrated in the figure, when an object to be exposed or the wafer 121 is placed on the stage 120 (Step S101), the optical-component fabricating apparatus 10 moves the wafer 121 to a position under the glass mask 100 (Step S102). The optical-component fabricating apparatus 10 then performs a first exposure (Step S103) and moves the wafer away from the area under the glass mask 100 (Step S104).

Subsequently, the wafer 121 is moved to a position under the nozzle 140 (Step S105), and the alignment mark is developed (Step S106). The wafer is then moved to a position under the glass mask 100 (Step S107), and the alignment mark is observed (Step S108).

When patterns are joined together with respect to the x axis direction (Yes at Step S109), the optical-component fabricating apparatus 10 overlaps the right edge of the previously developed alignment mark with the left edge of the mask alignment mark (Step S110). When patterns are joined together with respect to the y axis direction (No at Step S109), the lower edge of the previously developed alignment mark is overlapped with the upper edge of the mask alignment mark (Step S111).

After that, the optical-component fabricating apparatus 10 performs a second exposure (Step S112), and moves the wafer 121 to a position away from the area under the glass mask 100 (Step S113). Subsequently, the optical-component fabricating apparatus 10 moves the wafer 121 to a position under the nozzle 140 (Step S114) and develops the alignment mark (Step S115).

The optical-component fabricating apparatus 10 then moves the wafer to a position under the glass mask 100 (Step S116), and determines whether all the exposure process is completed and the sequentially joined patterns are formed (Step S117). If it is determined that all the exposure process is not completed (No at Step S117), the process control returns to S108, performs the observation of the alignment mark, and repeats the process that involves overlapping the previous alignment mark with the mask alignment mark and then exposing an alignment mark (Steps S108 to S117).

If all the exposure process is completed and the sequentially joined patterns are formed (Yes at Step S117), the optical-component fabricating apparatus 10 develops the exposure patterns and etches the developed exposure patterns (Step S118). The etching process can be performed not by the optical-component fabricating apparatus 10 but by another device.

Effects of the First Embodiment

As described above, the optical-component fabricating apparatus 10 arranges the glass mask 100, which has both the exposure pattern 101 and the alignment mark 102, and the wafer 121, which is developed through the glass mask 100, at predetermined positions and exposes both the exposure pattern 101 and the alignment mark 102 onto the wafer 121. The optical-component fabricating apparatus 10 develops the alignment mark 102 exposed on the wafer 121 and observes the position of the developed alignment mark 102. The optical-component fabricating apparatus 10 then moves the wafer 121 in accordance with the position of the alignment mark 102 and repeats the exposure, the development, and the movement a predetermined number of times, develops all the exposure patterns 101 on the wafer 121, and etches the developed exposure patterns 101.

In other words, when the exposure patterns 101 are joined together, the optical-component fabricating apparatus 10 exposes the exposure pattern 101 and the alignment mark 102 that are arranged in a certain relative positional relation, develops the alignment mark 102 only, and decides the next position to be exposed to a shot in accordance with the developed alignment mark. Therefore, because misalignment of the wafer caused by mechanical driving is not affected, it is possible to join patterns together accurately.

[b] Second Embodiment

Although, in the first embodiment as described above, the exposure-pattern joining process uses the exposure pattern and the alignment pattern that have the same size and the same angle, the present embodiment is not limited thereto. In other words, it is allowable to join exposure patterns together by using an exposure pattern and an alignment mark that have different sizes and different angles.

In the following second embodiment, as a way of exposing sequential patterns when X and Y of an exposure pattern are different from x and y indicated by four points of an alignment mark, the process performed by an optical-component fabricating apparatus will be explained with reference to FIGS. 7 to 11 according to the second embodiment. Because the configuration of the optical-component fabricating apparatus according to the second embodiment is the same as the configuration of the optical-component fabricating apparatus according to the first embodiment, the same explanation is not repeated.

First of all, the relation between an exposure pattern and an alignment mark of the second embodiment will be explained with reference to FIG. 7. FIG. 7 is a diagram that illustrates the relation between a pattern and an alignment mark. As illustrated in FIG. 7, the glass mask according to the second embodiment has an exposure pattern and an alignment mark in which the pattern width X is not equal to the alignment-mark width x and the pattern height Y is not equal to the alignment-mark height y. Alternatively, in the glass mask 100 according to the second embodiment, the angle Θ between the pattern and the stage moving axis is unequal to the angle θ between the alignment mark and the stage moving axis, or the shape of the pattern is not the same as the shape of the alignment mark.

In other words, as illustrated in FIG. 7, the glass mask according to the second embodiment corresponds to any of X and Y of the pattern being unequal to x and y indicated by the four points of the alignment mark, the angle Θ between the exposure pattern and the stage moving axis being unequal to the angle θ between the alignment mark and the stage moving axis, and the shape of the alignment mark being different from the actual shape.

Before a wafer is moved to a predetermined position, an optical-component fabricating apparatus 10a that has the abovementioned glass mask exposes and develops an exposure pattern and an alignment mark on a test wafer, observes the position of the optical component pattern and the position of the alignment mark pattern on the test wafer, and calculates the positional relation between the exposure pattern and the alignment mark.

More particularly, the optical-component fabricating apparatus 10a performs position alignment by using the alignment mark and, before performing the exposure-pattern joining process, performs test shot exposure, thereby exposing the exposure pattern and the alignment mark pattern on the test wafer.

The optical-component fabricating apparatus 10a then develops the exposure pattern and the alignment mark. After that, the stage 120 is moved to a position to check the developed pattern with the microscope 130 and the developed exposure pattern is overlapped with the exposure pattern on the glass mask. The optical-component fabricating apparatus 10a records stage coordinates (A1, B1).

Figure 9:
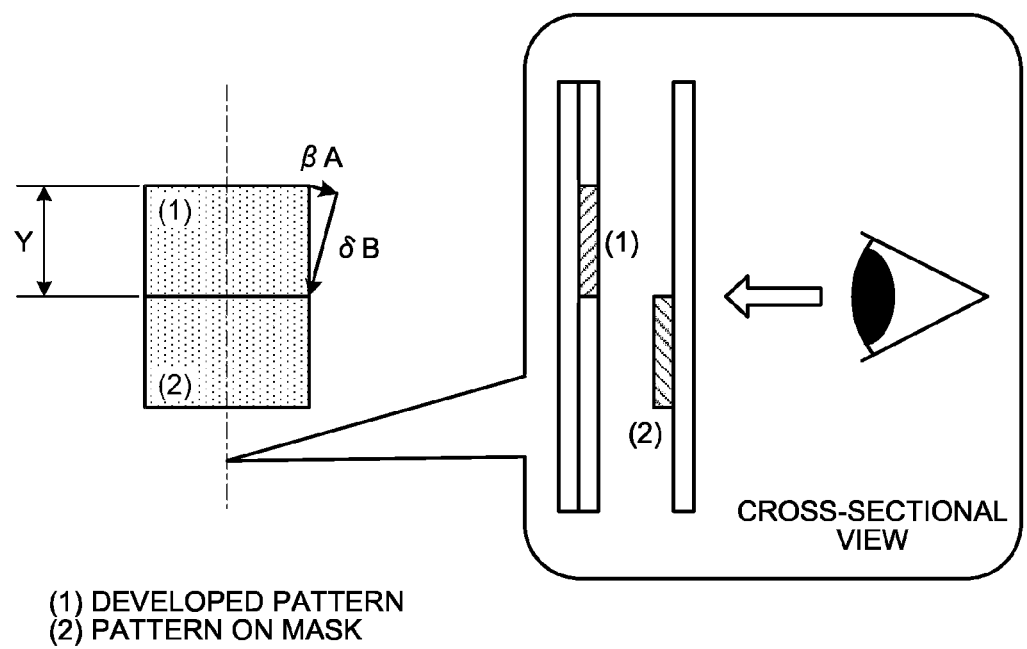
FIG. 9 is a diagram that illustrates a moving-amount-for-joining calculating process.

As illustrated in FIGS. 8 and 9, the optical-component fabricating apparatus 10a places the developed exposure pattern (see (1) of FIGS. 8 and 9) adjacent to the exposure pattern on the glass mask (see (2) of FIGS. 8 and 9), i.e., moves the developed exposure pattern to a apparently joined position, and records stage coordinates (A2, B2). FIGS. 8 and 9 are diagrams that illustrate a stage-moving-amount-for joining calculating process. FIG. 8 illustrates an example where exposure patterns are joined together rightward (in the x axis direction) and FIG. 9 illustrates an example where exposure patterns are joined together downward (in the y axis direction).

The optical-component fabricating apparatus 10a then calculates, by using the two coordinate values (A1, B1) and (A2, B2), a stage moving amount αA+γB (or βA+δB) to join the patterns together. More particularly, for the process for calculating the stage moving amount αA+γB, the optical-component fabricating apparatus 10a calculates "(A2−A1, B2−B1)=(αA, γB)", thereby calculating a stage moving amount XA (αA, γB). As illustrated in FIG. 9, for the process for calculating the stage moving amount βA+δB, the optical-component fabricating apparatus 10a calculates "(A2−A1, B2−B1)=(βA, δB)", thereby calculating a stage moving amount XA (βA, δB).

If the size of the pattern is so small that the effects of the stage moving accuracy are to be taken into consideration, it is possible to reduce the effects of a stage moving error by repeating the calculation for (αA, γB) or (βA, δB) several times and calculating the average.

After the stage moving amount is calculated, the optical-component fabricating apparatus 10a moves the wafer also in accordance with the stage moving amount and performs the exposure-pattern joining process. More particularly, in the same manner as in the first embodiment, the optical-component fabricating apparatus 10a performs a first exposure and then develops the alignment mark only.

When patterns are joined together with respect to the x axis direction, the optical-component fabricating apparatus 10a overlaps the developed alignment with the alignment on the glass mask and moves the wafer the stage moving amount XA (αA+γB). When patterns are joined together with respect to the y axis direction, the optical-component fabricating apparatus 10a overlaps the developed alignment with the alignment on the glass mask and moves the wafer the stage moving amount XA (βA, δB).

After that, the optical-component fabricating apparatus 10a performs a second exposure at the position after movement and develops the alignment mark only. The optical-component fabricating apparatus 10a repeats the process that involves overlapping the developed alignment with the alignment on the glass mask and moving the wafer the stage moving amount XA (αA+γB), thereby performing the exposure-pattern joining process.

The process performed by the optical-component fabricating apparatus 10a will be explained with reference to FIGS. 10 and 11 according to the second embodiment. FIG. 10 is a flowchart of the process performed by the optical-component fabricating apparatus 10a according to the second embodiment. FIG. 11 is a flowchart of the moving-amount calculating process performed by the optical-component fabricating apparatus 10a according to the second embodiment. The process performed by the optical-component fabricating apparatus 10a according to the second embodiment is different from the process performed by the optical-component fabricating apparatus 10 according to the first embodiment illustrated in FIG. 6 in that the moving-amount calculating process is added.

As illustrated in FIG. 10, in the second embodiment, when the wafer 121 is placed on the stage 120 (Step S201) and it is moved to a position under the glass mask 100 (Step S202), before the exposure-pattern joining process, the optical-component fabricating apparatus 10a performs the moving-amount calculating process to calculate the stage moving amount (which will be explained detailed later with reference to FIG. 11) (Step S203).

Subsequently, in the same manner as in the first embodiment, the optical-component fabricating apparatus 10a performs a first exposure, then develops the alignment mark only (Steps S204 to S208), and then observes the alignment mark (Step S209). After that, when patterns are joined together with respect to the x axis direction (Yes at Step S210), the optical-component fabricating apparatus 10a overlaps the developed alignment with the alignment on the glass mask (Step S211), and moves the wafer the stage moving amount XA ($\alpha$A+$\gamma$B) (Step S212).

When patterns are joined together with respect to the y axis direction (No at Step S210), the optical-component fabricating apparatus 10a overlaps the developed alignment with the alignment on the glass mask (Step S213), and moves the wafer the stage moving amount XA ($\beta$A, $\delta$B) (Step S214).

After that, the optical-component fabricating apparatus 10a performs a second exposure at the position after movement (Step S215), and develops, in the same manner as in the first embodiment, the alignment mark only (Steps S216 to S219). If all the exposure process is not completed (No at Step S220), the optical-component fabricating apparatus 10a repeats the process that involves overlapping the developed alignment with the alignment on the glass mask and then moving the wafer the stage moving amount XA ($\alpha$A+$\gamma$B) (Steps S209 to S220), thereby performing the exposure-pattern joining process.

If all the exposure process is completed and sequentially joined patterns are formed (Yes at Step S220), the optical-component fabricating apparatus 10a develops the exposure patterns and etches the developed exposure pattern (Step S221).

Subsequently, the moving-amount calculating process performed by the optical-component fabricating apparatus 10a will be explained according to the second embodiment. The optical-component fabricating apparatus 10a performs a test shot exposure, thereby exposing the exposure pattern and the alignment mark pattern on a test wafer (Step S301), and moves the wafer away from the area under the glass mask 100 (Step S302).

The optical-component fabricating apparatus 10a then moves the wafer 121 to a position under the nozzle 140 (Step S303), and develops the exposure pattern and the alignment mark (Step S304). Subsequently, the optical-component fabricating apparatus 10a moves the wafer to a position under the glass mask 100 (Step S305), overlaps the developed exposure pattern with the mask pattern (Step S306), and reads the stage coordinates (A1, B1) (Step S307).

Subsequently, the optical-component fabricating apparatus 10a moves the wafer so that the developed exposure pattern and the exposure pattern on the glass mask are arranged side by side (Step S308), and reads the stage coordinates (A2, B2) (Step S309). The stage moving amount $\alpha$A+$\gamma$B (or $\beta$A+$\delta$B) that is needed for joining is calculated by using the two coordinate values (Step S310).

More particularly, for the process for calculating the stage moving amount $\alpha$A+$\gamma$B, the optical-component fabricating apparatus 10a calculates "(A2−A1, B2−B1)=($\alpha$A, $\gamma$B)", thereby calculating the stage moving amount XA ($\alpha$A, $\gamma$B). For the process for calculating the stage moving amount $\beta$A+$\delta$B, the optical-component fabricating apparatus 10a calculates "(A2−A1, B2−B1)=($\beta$A, $\delta$B)", thereby calculating the stage moving amount XA ($\beta$A, $\delta$B).

As described above, in second embodiment, before a wafer is arranged to a predetermined position, the optical-component fabricating apparatus 10a exposes and develops an optical component pattern and an alignment mark on a test wafer by using a mask and observes the position of the exposure pattern and the position of the alignment mark on the test wafer. After that, the optical-component fabricating apparatus 10a calculates the positional relation between the exposure pattern and the alignment mark and moves the wafer also in accordance with the positional relation.

Therefore, even if the exposure pattern and the alignment mark have different sizes and different angles, because exposure patterns are joined together by using the stage moving amount, patterns are joined together accurately.

Of the processes described in the first embodiment and the second embodiment, all or part of the processes explained as being performed automatically can be performed manually and all or part of the processes explained as being performed manually can be performed automatically by a known method. For example, the alignment-mark observing process and the stage moving process can be either manually or automatically.

According to an aspect of the method of the present invention, patterns are joined together accurately without limiting the type of the resist used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical-component fabricating method comprising:
   arranging a mask that has both an optical component pattern and an alignment mark pattern and a wafer that is developed through the mask at predetermined positions;
   exposing the optical component pattern and the alignment mark pattern onto the wafer;
   developing, partially, the alignment mark pattern only, from among the optical component pattern and the alignment mark pattern that are exposed on the wafer;
   observing a position of the developed alignment mark pattern and moving the wafer so as to join the observed position of the developed alignment mark pattern to a position of the alignment mark pattern formed on the mask;
   repeating the exposing, the developing, and the moving a predetermined number of times;
   developing all the optical component patterns on the wafer; and
   etching the developed optical component patterns.

2. The optical-component fabricating method according to claim 1, further comprising:

exposing and developing both the optical component pattern and the alignment mark pattern through the mask on a test wafer before the wafer is arranged at the predetermined position;

observing a position of the optical component pattern and a position of the alignment mark pattern on the test wafer;

calculating a positional relation between the optical component pattern and the alignment mark pattern; and moving the wafer also in accordance with the positional relation.

3. An optical-component fabricating apparatus comprising:

a mask holding unit that holds a mask that has both an optical component pattern and an alignment mark pattern;

a wafer holding unit that holds a wafer that is developed through the mask and moves the wafer on a plane that is parallel to the mask;

an exposing unit that exposes the optical component pattern and the alignment mark pattern onto the wafer;

a developing unit that partially develops the alignment mark pattern only, from among the optical component pattern and the alignment mark pattern that are exposed on the wafer;

an observing unit that observes a position of the developed alignment mark pattern; and a control unit that controls the wafer holding unit to decide the position of the wafer so as to join the observed position of the developed alignment mark pattern to a position of the alignment mark pattern formed on the mask.

4. The optical-component fabricating apparatus according to claim 3, wherein the control unit decides the position of the wafer also in accordance with a positional relation between the optical component pattern and the alignment mark pattern.

5. An optical-component fabricating apparatus comprising:

a mask holding unit that holds a mask that has both an optical component pattern and an alignment mark pattern;

a wafer holding unit that holds a wafer that is developed through the mask and moves the wafer on a plane that is parallel to the mask;

an exposing unit that exposes the optical component pattern and the alignment mark pattern onto the wafer;

a developing unit that partially develops the alignment mark pattern only, from among the optical component pattern and the alignment mark pattern that are exposed on the wafer;

an observing unit that observes a position of the developed alignment mark pattern;

a processor; and a memory, wherein the processor executes controlling the wafer holding unit to decide the position of the wafer so as to join the observed position of the developed alignment mark pattern to a position of the alignment mark pattern formed on the mask.

\* \* \* \* \*